(12) United States Patent
Fenzi et al.

(10) Patent No.: US 11,817,845 B2
(45) Date of Patent: Nov. 14, 2023

(54) METHOD FOR MAKING TRANSVERSELY-EXCITED FILM BULK ACOUSTIC RESONATORS WITH PIEZOELECTRIC DIAPHRAGM SUPPORTED BY PIEZOELECTRIC SUBSTRATE

(71) Applicant: Murata Manufacturing Co., Ltd., Nagaokakyo (JP)

(72) Inventors: Neal Fenzi, Santa Barbara, CA (US); Robert Hammond, Santa Barbara, CA (US); Patrick Turner, San Bruno, CA (US); Bryant Garcia, Burlingame, CA (US); Ryo Wakabayashi, Santa Clara, CA (US)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 359 days.

(21) Appl. No.: 17/131,485

(22) Filed: Dec. 22, 2020

(65) Prior Publication Data

US 2022/0014161 A1 Jan. 13, 2022

Related U.S. Application Data

(63) Continuation of application No. 17/131,414, filed on Dec. 22, 2020, now Pat. No. 11,482,981.
(Continued)

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC .. H03H 9/02228; H03H 3/02; H03H 9/02031; H03H 9/174; H03H 9/176;
(Continued)

(56) References Cited

U.S. PATENT DOCUMENTS

| 5,446,330 A | 8/1995 | Eda et al. |
| 5,552,655 A | 9/1996 | Stokes et al. |

(Continued)

FOREIGN PATENT DOCUMENTS

| WO | 2016017104 | 2/2016 |
| WO | 2018003273 A1 | 1/2018 |

OTHER PUBLICATIONS

T. Takai, H. Iwamoto, et al., "I.H.P. Saw Technology and its Application to Microacoustic Components (Invited)." 2017 IEEE International Ultrasonics Symposium, Sep. 6-9, 2017. pp. 1-8.
(Continued)

*Primary Examiner* — Rakesh B Patel
*Assistant Examiner* — Jorge L Salazar, Jr.
(74) *Attorney, Agent, or Firm* — ARENTFOX SCHIFF LLP

(57) ABSTRACT

Methods of making acoustic resonators and filter devices. A method includes attaching a piezoelectric plate to a substrate, and forming a conductor pattern including an interdigital transducer (IDT) on a portion of the piezoelectric plate that forms a diaphragm spanning a cavity such that interleaved fingers of the IDT are on the diaphragm. The substrate and the piezoelectric plate are the same material.

18 Claims, 11 Drawing Sheets

Related U.S. Application Data

(60) Provisional application No. 63/050,014, filed on Jul. 9, 2020.

(51) Int. Cl.
  *H03H 9/17* (2006.01)
  *H03H 9/56* (2006.01)

(52) U.S. Cl.
  CPC ............ *H03H 9/174* (2013.01); *H03H 9/176* (2013.01); *H03H 9/562* (2013.01); *H03H 9/564* (2013.01); *H03H 9/568* (2013.01); *H03H 2003/023* (2013.01)

(58) Field of Classification Search
  CPC ........ H03H 9/562; H03H 9/564; H03H 9/568; H03H 2003/023; H03H 9/02015
  USPC .......................................... 333/133, 193–196
  See application file for complete search history.

(56) References Cited

U.S. PATENT DOCUMENTS

| | | |
|---|---|---|
| 5,726,610 A | 3/1998 | Allen et al. |
| 5,853,601 A | 12/1998 | Krishaswamy et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia et al. |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski |
| 11,482,981 B2 * | 10/2022 | Fenzi ..................... H03H 9/568 |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata et al. |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0182510 A1 | 8/2007 | Park et al. |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi et al. |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto |
| 2011/0278993 A1 | 11/2011 | Iwamoto |
| 2012/0286900 A1 | 11/2012 | Kadota et al. |
| 2013/0234805 A1 | 9/2013 | Takahashi |
| 2013/0271238 A1 | 10/2013 | Onda et al. |
| 2013/0278609 A1 | 10/2013 | Stephanou et al. |
| 2013/0321100 A1 | 12/2013 | Wang |
| 2014/0009032 A1 * | 1/2014 | Takahashi ............... H03H 9/059 29/25.35 |
| 2014/0130319 A1 * | 5/2014 | Iwamoto ................ H03H 9/174 29/25.35 |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179225 A1 | 6/2017 | Lee et al. |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2017/0373241 A1 * | 12/2017 | Kimura ............... H03H 9/02669 |
| 2018/0005950 A1 | 1/2018 | Watanabe |
| 2018/0026603 A1 | 1/2018 | Iwamoto |
| 2018/0033952 A1 | 2/2018 | Yamamoto et al. |
| 2018/0062615 A1 | 3/2018 | Kato et al. |
| 2018/0062617 A1 | 3/2018 | Yun et al. |
| 2018/0123016 A1 | 5/2018 | Gong et al. |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1 | 9/2019 | Lin |
| 2019/0348966 A1 | 11/2019 | Campanella-Pineda et al. |

(56) References Cited

U.S. PATENT DOCUMENTS

| | | |
|---|---|---|
| 2020/0036357 A1 | 1/2020 | Mimura |
| 2020/0235719 A1 | 7/2020 | Yantchev et al. |

OTHER PUBLICATIONS

R. Olsson III, K. Hattar et al. "A high electromechanical coupling coefficient SHO Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A.. (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics SYMPOSIUM—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

Acoustic Properties of Solids ONDA Corporation 592 Weddell Drive, Sunnyvale, CA 94089, Apr. 11, 2003, pp. 5 (Year 2003).

Bahreynl, B. Fabrication and Design of Resonant Microdevices Andrew William, Inc. 2018, NY (Year 2008).

Material Properties of Tibtech Innovations, © 2018 TIBTECH Innovations (Year 2018).

Buchanan, R., "Ceramic Materials for Electronics," CRC Press, 3rd Edition, Revised and Expanded, 2018, First Published 2004, 4 pages.

Guyette, A., "Theory and Design of Intrinsically Switched Mulitplexers With Optimum Phase Linearity," IEEE Transactions on Microwave Theory and Techniques, Sep. 2013, vol. 61, No. 9, pp. 3254-3264.

International Search Report and Written Opinion in PCT/US2020/45654, dated Oct. 29, 2020, 9 pages.

Kadota et al., "5.4 GHz Lamb Wave Resonator on LiNbO3 Thin Crystal Plate and Its Application," Japanese Journal of Applied Physics, 2011, vol. 50, 07HD11, 4 pages.

Namdeo et al., "Simulation on Effects of Electrical Loading due to Interdigital Transducers in Surface Acoustic Wave Resonator," Procedia Engineering, 2013, vol. 64, International Conference on Design and Manufacturing, IConDM 2013, pp. 322-330.

Rodriguez-Madrid et al., "Super-High-Frequency SAW Resonators on AlN/Diamond," IEEE Electron Device Letters, Apr. 2012, vol. 33, No. 4, 3 pages.

Santosh, S.K., "Surface Acoustic Wave Devices on Silicon Substrate using Patterned and Thin Film ZnO," Indian nstitute of Technology Guwahati, Feb. 2016, Doctoral Thesis, Guwahati, Assam, India, 5 pages.

Sorokin et al., "Study of Microwave Acoustic Attenuation in a Multifrequency Bulk Acoustic Wave Resonator Based on a Synthetic Diamond Single Crystal," Acoustical Physics, 2015, vol. 61, No. 6, pp. 669-680.

Wong et al., "Broadband Piston Mode Operation for First-order Antisummetric Mode Resonators," 2020 IEEE International Ultrasonics Symposium, Sep. 2020, 4 pages.

Yang et al., "High Q Antisymmetric Mode Lithium Niobate MEMS Resonators With Spurious Mitigation," Journal of Microelectromechanical Systems, Apr. 2020, vol. 29, No. 2, 10 pages.

Zou, J., "High-Performance Aluminum Nitride Lamb Wave Resonators for RF Front-End Technology," University of California, Berkeley, 2015, Doctoral Disseration, 3 pages.

\* cited by examiner

METHOD FOR MAKING TRANSVERSELY-EXCITED FILM BULK ACOUSTIC RESONATORS WITH PIEZOELECTRIC DIAPHRAGM SUPPORTED BY PIEZOELECTRIC SUBSTRATE

RELATED APPLICATION INFORMATION

This patent is a continuation of application Ser. No. 17/131,414, filed Dec. 22, 2020, entitled TRANSVERSELY-EXCITED FILM BULK ACOUSTIC RESONATORS WITH PIEZOELECTRIC DIAPHRAGM SUPPORTED BY PIEZOELECTRIC SUBSTRATE, which claims priority from provisional patent application 63/050,014, filed Jul. 9, 2020, entitled XBAR USING PIEZOELECTRIC MEMBRANE SUPPORTED BY PIEZOELECTRIC SUBSTRATE, which is incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are n77, which uses the frequency range from 3300 MHz to 4200 MHz, and n79, which uses the frequency range from 4400 MHz to 5000 MHz. Both band n77 and band n79 use time-division duplexing (TDD), such that a communications device operating in band n77 and/or band n79 uses the same frequencies for both uplink and downlink transmissions. Bandpass filters for bands n77 and n79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

The Transversely-Excited Film Bulk Acoustic Resonator (XBAR) is an acoustic resonator structure for use in microwave filters. The XBAR is described in U.S. Pat. No. 10,491,291, titled TRANSVERSELY EXCITED FILM BULK ACOUSTIC RESONATOR. An XBAR resonator comprises an interdigital transducer (IDT) formed on a thin floating layer, or diaphragm, of a single-crystal piezoelectric material. The IDT includes a first set of parallel fingers, extending from a first busbar and a second set of parallel fingers extending from a second busbar. The first and second sets of parallel fingers are interleaved. A microwave signal applied to the IDT excites a shear primary acoustic wave in the piezoelectric diaphragm. XBAR resonators provide very high electromechanical coupling and high frequency capability. XBAR resonators may be used in a variety of RF filters including band-reject filters, band-pass filters, duplexers, and multiplexers. XBARs are well suited for use in filters for communications bands with frequencies above 3 GHz.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
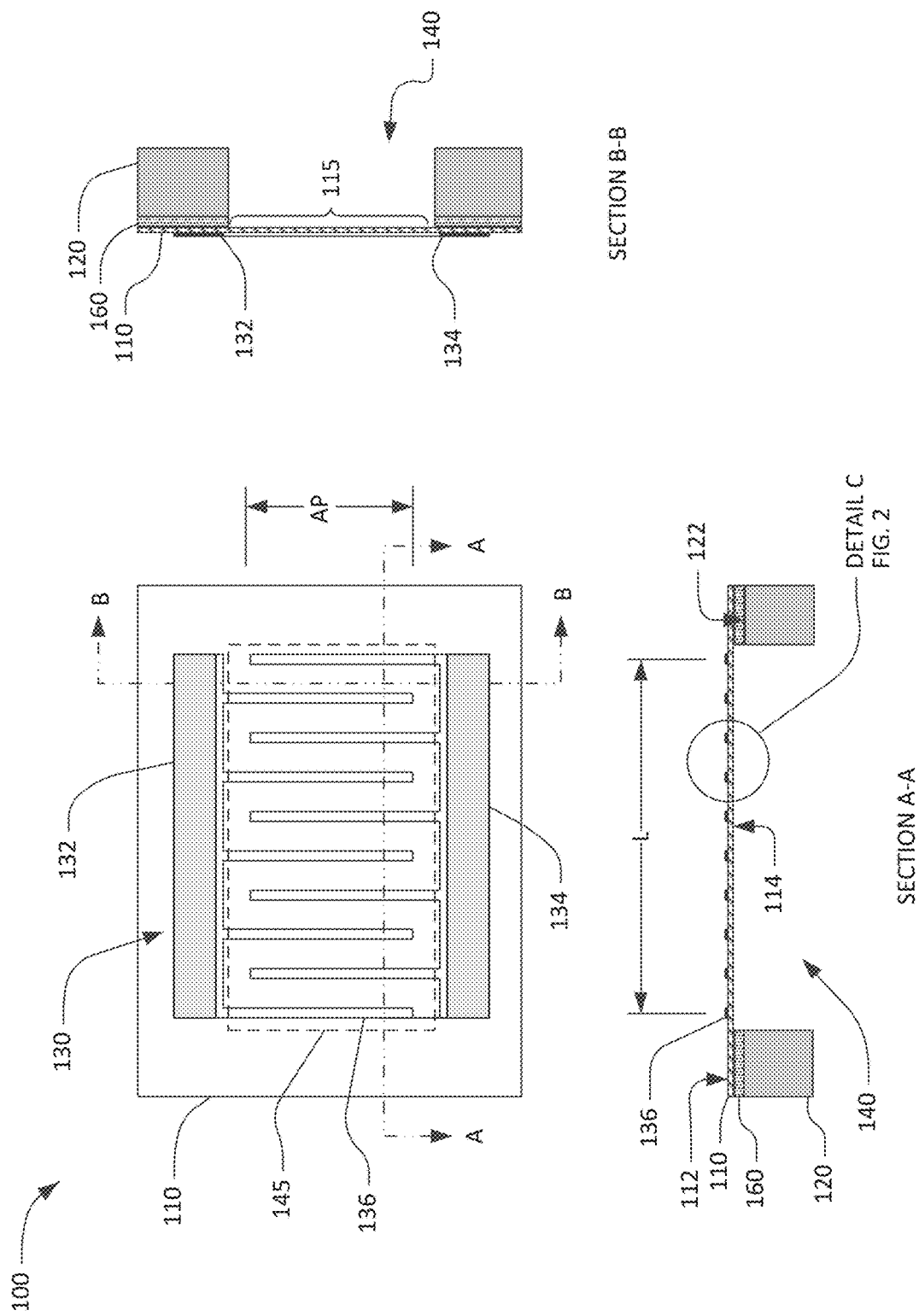
FIG. 1 is a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are well suited for use in filters for communications bands with frequencies above 3 GHz.

The XBAR 100 includes a piezoelectric plate 110 having a front surface 112 and a back surface 114. The front and back surfaces are essentially parallel. "Essentially parallel" means parallel to the extent possible within normal manufacturing tolerances. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. XBARs may be fabricated on piezoelectric plates with various crystallographic orientations including Z-cut, rotated Z-cut, and rotated Y-cut.

A surface 122 of a substrate 120 is attached to a back surface 114 of the piezoelectric plate 110. A portion of the piezoelectric plate 110 is not attached to the substrate 120 and forms a diaphragm 115 spanning a cavity 140 formed in the substrate 120. The portion of the piezoelectric plate that spans the cavity is referred to herein as the "diaphragm" due to its physical resemblance to the diaphragm of a microphone. As shown in FIG. 1, the diaphragm 115 is contiguous with the rest of the piezoelectric plate 110 around all of a perimeter 145 of the cavity 140. In this context, "contiguous" means "continuously connected without any intervening item". The substrate 120 provides mechanical support to the piezoelectric plate 110. The piezoelectric plate 110 may be attached directly to the substrate 120 or may be attached to the substrate 120 via one or more intermediate material layers.

The substrate 120 may be, for example, formed of the same materials as the piezoelectric plate 110. Forming the piezoelectric plate 110 and the substrate 120 of the same material prevents a thermal property mismatch between them, which could lead to a degradation in performance. Even with an intermediate material layer formed of a different material between the piezoelectric plate 110 and the substrate 120, the temperature coefficient of frequency (TCF) is improved (lowered) by having the substrate and the piezoelectric plate formed of the same material. Silicon has a linear coefficient of thermal expansion (CTE) of about $2.6 \times 10^{-6}$ IC, and lithium niobate has a linear CTE of about $7\text{-}15 \times 10^{-6}$/C. In other XBAR devices where the substrate is formed of a different material (e.g., silicon), the device would have a large CTE mismatch that would result in a large TCF. Having the piezoelectric plate 110 and the substrate formed of the same material prevents this problem.

In one example, the piezoelectric plate 110 can be attached to the substrate 120 via a buried oxide layer 160 (as shown in FIG. 1), which may be formed of $SiO_2$ or $Al_2O_3$, or any other suitable oxide that is selective to relevant etch chemistries (e.g., can be etched using a process that does not attack the piezoelectric plate). The buried oxide layer may also a dielectric and may be capable of acoustically isolating the piezoelectric plate 110 from the substrate 120. The buried oxide layer 160 is between the back surface 114 of the piezoelectric plate 110 and the surface 122 of the substrate 120. A thickness of the buried oxide layer 160 can be in a range from about 10 nm to 50 microns (e.g., 2 microns to 20 microns), depending on fabrication requirements. The buried oxide layer 160 is shown in FIG. 1 not extending across the portion of the piezoelectric plate 110 that forms the diaphragm 115. However, the buried oxide layer 160 may alternatively extend across the diaphragm 115.

The back surface 114 of the piezoelectric plate 110 and the front surface of the buried oxide layer 160, and the back surface of the buried oxide layer 160 and the surface of the substrate 120 may be attached using a wafer bonding process. Alternatively, the piezoelectric plate 110 may be grown on the buried oxide layer 160, and the buried oxide layer 160 may be grown on the substrate 120.

The cavity 140 is an empty space within a solid body of the resonator 100. The cavity 140 may be a hole completely through the substrate 120 (as shown in Section A-A and Section B-B) or a recess in the substrate 120 (as shown subsequently in FIG. 3). The cavity 140 may be formed, for example, by selective etching of the substrate 120 and/or the buried oxide layer 160 before or after the piezoelectric plate 110, the buried oxide layer 160, and the substrate 120 are attached.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites a primary acoustic mode within the piezoelectric plate 110. As will be discussed in further detail, the primary acoustic mode is a bulk shear mode where acoustic energy propagates along a direction substantially orthogonal to the surface of the piezoelectric plate 110, which is also normal, or transverse, to the direction of the electric field created by the IDT fingers. Thus, the XBAR is considered a transversely-excited film bulk wave resonator.

The IDT 130 is positioned on the piezoelectric plate 110 such that at least the fingers of the IDT 130 are disposed on the portion 115 of the piezoelectric plate that spans, or is suspended over, the cavity 140. As shown in FIG. 1, the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. An XBAR for a 5G device will have an IDT with more than ten parallel fingers. An XBAR may have hundreds, possibly thousands, of parallel fingers in the IDT. Similarly, the thickness of all elements is greatly exaggerated in the in the cross-sectional views.

Figure 2:
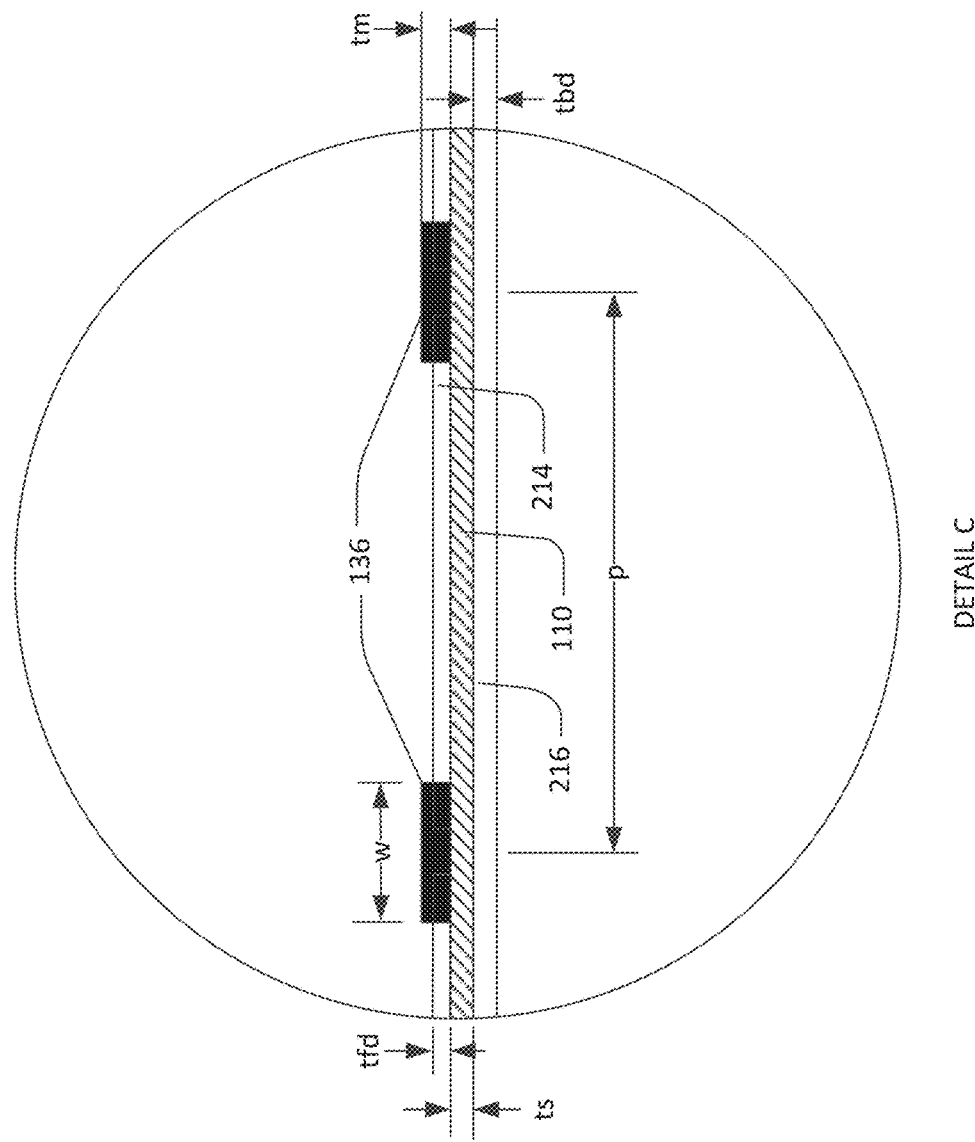
FIG. 2 is an expanded schematic cross-sectional view of a portion of the XBAR of FIG. 1.

FIG. 2 shows a detailed schematic cross-sectional view of the XBAR 100. The portion of the XBAR 100 shown in FIG. 2 is identified in FIG. 1 as "DETAIL C". The piezoelectric plate 110 is a single-crystal layer of piezoelectrical material having a thickness ts. ts may be, for example, 100 nm to 1500 nm. When used in filters for bands from 3.4 GHZ to 6 GHz (e.g. bands n77, n79, 5 GHz Wi-Fi™, 6 GHz Wi-Fi™), the thickness ts may be, for example, 200 nm to 1000 nm.

A front-side dielectric layer 214 may be formed on the front side of the piezoelectric plate 110. The "front side" of the XBAR is the surface facing away from the substrate. The front-side dielectric layer 214 has a thickness tfd. The front-side dielectric layer 214 is formed between the IDT fingers 136. Although not shown in FIG. 2, the front-side dielectric layer 214 may also be deposited over the IDT fingers 136. A back-side dielectric layer 216 may be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 136 may be one or more layers of aluminum, an aluminum alloy, copper, a copper alloy, beryllium, gold, tungsten, molybdenum or some other conductive material. The IDT fingers are considered to be "substantially aluminum" if they are formed from aluminum or an alloy comprising at least 50% aluminum. The IDT fingers are considered to be "substantially copper" if they are formed from copper or an alloy comprising at least 50% copper. The IDT fingers are considered to be "substantially molybdenum" if they are formed from molybdenum or an alloy comprising at least 50% molybdenum. Thin (relative to the total thickness of the conductors) layers of other metals, such as chromium or titanium, may be formed under and/or over and/or as layers within the fingers to improve adhesion between the fingers and the piezoelectric plate 110 and/or to passivate or encapsulate the fingers and/or to improve power handling. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The geometry of the IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width is about one-fourth of the acoustic wavelength at resonance). In an XBAR, the pitch p of the IDT is typically 2 to 20 times the width w of the fingers. In addition, the pitch p of the IDT is typically 2 to 20 times the thickness is of the piezoelectric plate 212. The width of the IDT fingers in an XBAR is not constrained to be near one-fourth of the acoustic wavelength at resonance. For example, the width of XBAR IDT fingers may be 500 nm or greater, such that the IDT can be readily fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

Figure 3:
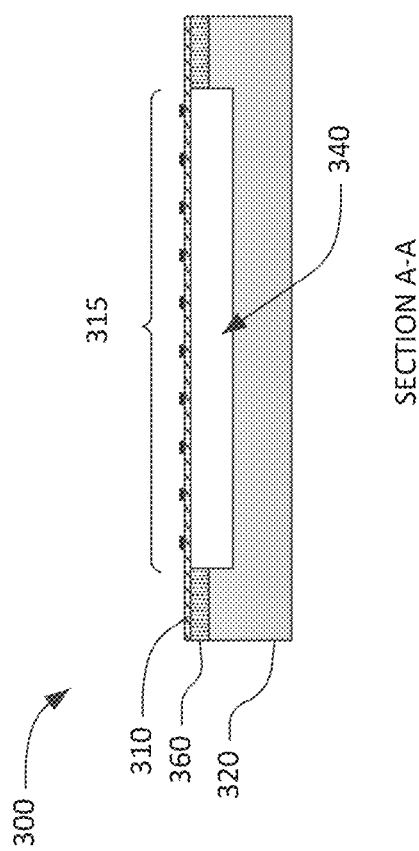
FIG. 3 is an alternative schematic cross-sectional view of the XBAR of FIG. 1.

FIG. 3 is an alternative cross-sectional view along the section plane A-A defined in FIG. 1. In FIG. 3, a piezoelectric plate 310 is attached to a substrate 320 via a buried oxide layer 360. Optionally, a piezoelectric plate 310 is attached directly to a substrate 320. In either case, the piezoelectric plate 310 and the substrate 320 are formed of the same material. A portion of the piezoelectric plate 310 forms a diaphragm 315 spanning a cavity 340 in the substrate. The cavity 340 does not fully penetrate the substrate 320. Fingers of an IDT are disposed on the diaphragm 315. The cavity 340 may be formed, for example, by etching the substrate 320 before attaching the piezoelectric plate 310 or buried oxide layer 360. Alternatively, the cavity 340 may be formed by etching the substrate 320 with a selective etchant that reaches the substrate through one or more openings (not shown) provided in the piezoelectric plate 310 and/or the buried oxide layer 360. In this case, the diaphragm 315 may be contiguous with the rest of the piezoelectric plate 310 around a large portion of a perimeter of the cavity 340. For example, the diaphragm 315 may be contiguous with the rest of the piezoelectric plate 310 around at least 50% of the perimeter of the cavity 340.

The cavity 340 may only extend through the buried oxide layer 360 and may not extend through the substrate 320. Alternatively, the cavity 340 may extend through the substrate 320 and not through the buried oxide layer 360. In another alternative, the cavity 340 may extend through both the buried oxide layer 360 and the substrate 320.

Figure 4:
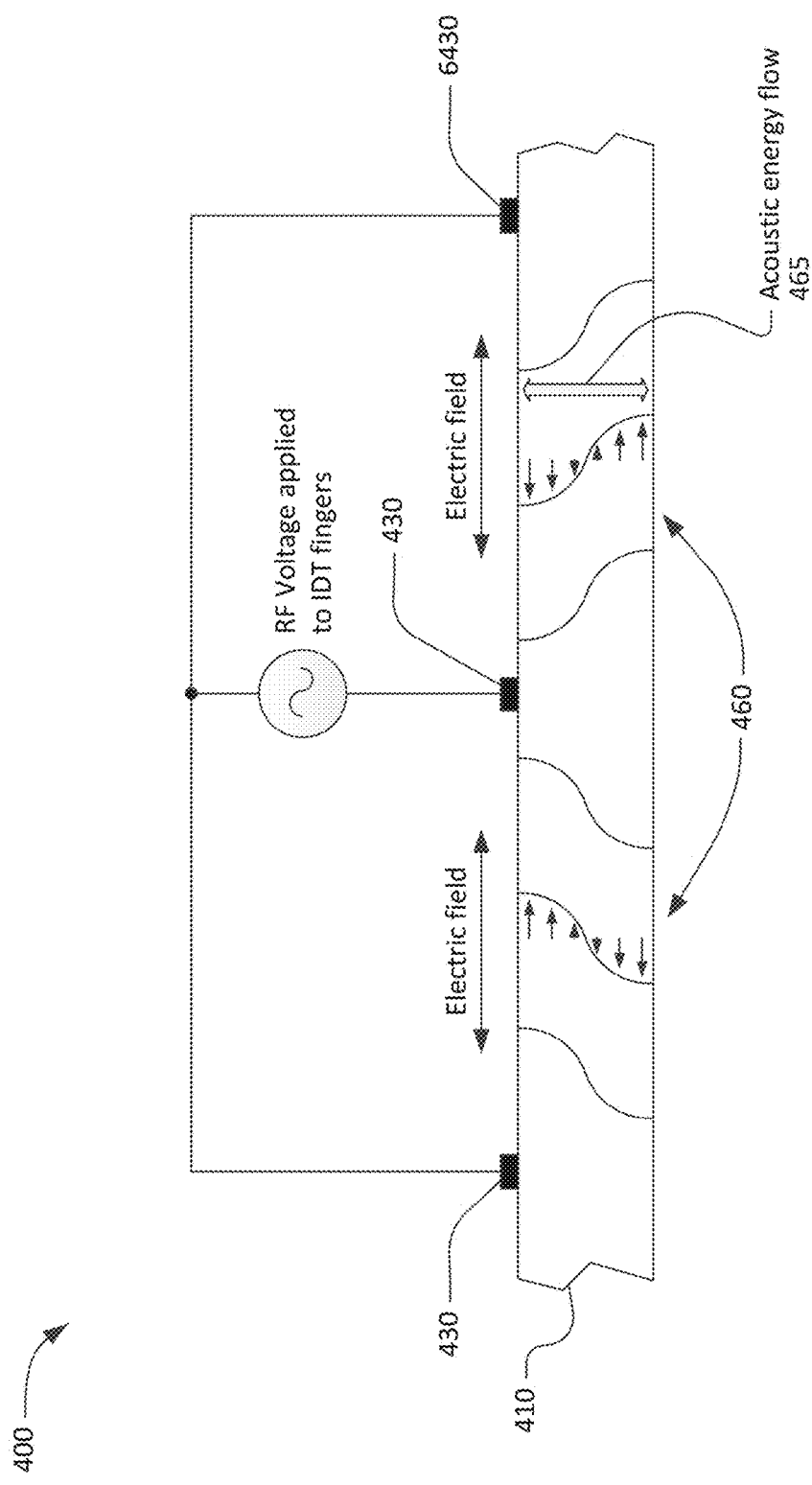
FIG. 4 is a graphic illustrating a shear primary acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. A radio frequency (RF) voltage is applied to the interleaved fingers 430. This voltage creates a time-varying electric field between the fingers. The direction of the electric field is primarily lateral, or parallel to the surface of the piezoelectric plate 410, as indicated by the arrows labeled "electric field". Since the dielectric constant of the piezoelectric plate is significantly higher than the surrounding air, the electric field is highly concentrated in the plate relative to the air. The lateral electric field introduces shear deformation, and thus strongly excites a shear-mode acoustic mode, in the piezoelectric plate 410. Shear deformation is deformation in which parallel planes in a material remain parallel and maintain a constant distance while translating relative to each other. A "shear acoustic mode" is an acoustic vibration mode in a medium that results in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the excited primary shear acoustic mode is substantially orthogonal to the surface of the piezoelectric plate, as indicated by the arrow 465.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. High piezoelectric coupling enables the design and implementation of microwave and millimeter-wave filters with appreciable bandwidth.

Figure 5:
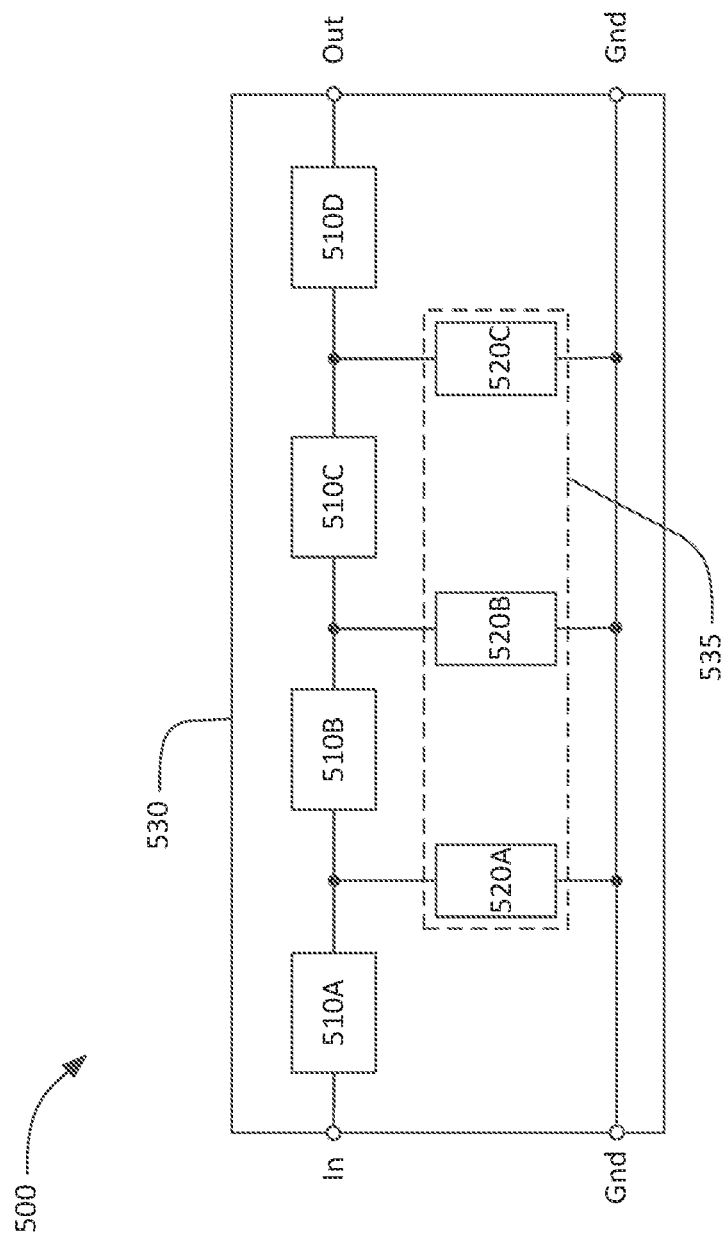
FIG. 5 is a schematic block diagram of a filter using XBARs.

FIG. 5 is a schematic circuit diagram and layout for a high frequency band-pass filter 500 using XBARs. The filter 500 has a conventional ladder filter architecture including four series resonators 510A, 510B, 510C, 510D and three shunt resonators 520A, 520B, 520C. The series resonators 510A, 510B, 510C, and 510D are connected in series between a first port and a second port (hence the term "series resonator"). In FIG. 5, the first and second ports are labeled "In" and "Out", respectively. However, the filter 500 is bidirectional and either port may serve as the input or output of the filter. The shunt resonators 520A, 520B, 520C are connected from nodes between the series resonators to ground. A filter may contain additional reactive components, such as inductors, not shown in FIG. 5. All the shunt resonators and series resonators are XBARs. The inclusion of four series and three shunt resonators is exemplary. A filter may have more or fewer than seven total resonators, more or fewer than four series resonators, and more or fewer than three shunt resonators. Typically, all of the series resonators are connected in series between an input and an output of the filter. All of the shunt resonators are typically connected between ground and the input, the output, or a node between two series resonators.

In the exemplary filter 500, the series resonators 510A, B, C, D and the shunt resonators 520A, B, D of the filter 500 are formed on a single plate 530 of piezoelectric material bonded to a silicon substrate (not visible). Each resonator includes a respective IDT (not shown), with at least the fingers of the IDT disposed over a cavity in the substrate. In this and similar contexts, the term "respective" means "relating things each to each", which is to say with a one-to-one correspondence.

Each of the resonators 510A, 510B, 510C, 510D, 520A, 520B, 520C in the filter 500 has a resonance where the admittance of the resonator is very high and an anti-resonance where the admittance of the resonator is very low. The resonance and anti-resonance occur at a resonance frequency and an anti-resonance frequency, respectively, which may be the same or different for the various resonators in the filter 700. In over-simplified terms, each resonator can be considered a short-circuit at its resonance frequency and an open circuit at its anti-resonance frequency. The input-output transfer function will be near zero at the resonance frequencies of the shunt resonators and at the anti-resonance frequencies of the series resonators. In a typical filter, the resonance frequencies of the shunt resonators are positioned below the lower edge of the filter's passband and the anti-resonance frequencies of the series resonators are position above the upper edge of the passband.

FIGS. 6A-6F are schematic cross-sectional views of an XBAR illustrating steps of a process of making an XBAR or a filter incorporating XBARs. The process starts in FIG. 6A with a substrate 620 and ends at FIG. 6F with a completed XBAR or filter. FIGS. 6A-6F include only major process steps. Various conventional process steps (e.g. surface preparation, cleaning, inspection, baking, annealing, monitoring, testing, etc.) may be performed before, between, after, and during the steps shown in FIGS. 6A-6F. The substrate 620 and the piezoelectric plate 610 in later figures are the same material, and may be lithium niobate or lithium tantalate, and Z-cut, rotated Z-cut, or rotated YX-cut, or some other cut.

Figure 6A:
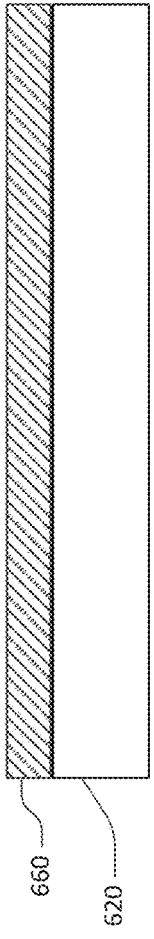
FIGS. 6A-6F are schematic cross-sectional views of an XBAR illustrating steps of a process of making the XBAR.

In FIG. 6A, a buried oxide layer 660 may be formed by depositing $SiO_2$, $Al_2O_3$, or another dielectric material on a surface of the substrate 620. Once deposited, the buried oxide layer 660 may need planarization or other processing to achieve a suitable surface. Alternatively, the buried oxide layer 660 can be formed separately and then bonded to the substrate 620. Typically, the mating surfaces of the buried oxide layer 660 and the substrate 620 are highly polished. An intermediate material may be formed or deposited on the mating surface of one or both of the substrate 620 and the buried oxide layer 660. One or both mating surfaces may be activated using, for example, a plasma process. The mating surfaces may then be pressed together with considerable force to establish molecular bonds between the substrate 620 and the buried oxide layer 660 or intermediate material layers. A thickness of the buried oxide layer 660 may be adjusted at this step, for example, by polishing or etching. In an example, the thickness of the buried oxide layer 660 can be in a range from 2 microns to 50 microns (e.g., 2 microns to 20 microns).

Figure 6B:
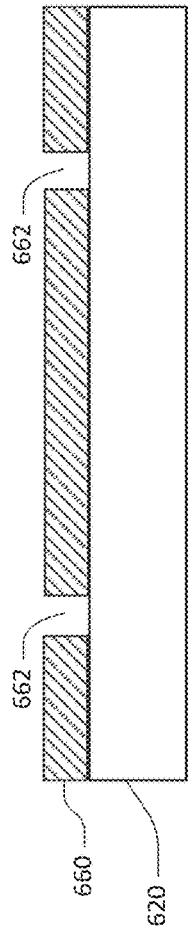

In FIG. 6B, portions 662 of the buried oxide layer 660 are removed that define an edge of a cavity to be formed. The portions 662 can be removed via any suitable method, such as mechanical removal or selective etching. Alternatively, the buried oxide layer 660 can be formed or deposited with these portions 662 already absent, for example, by using a mask.

Figure 6C:
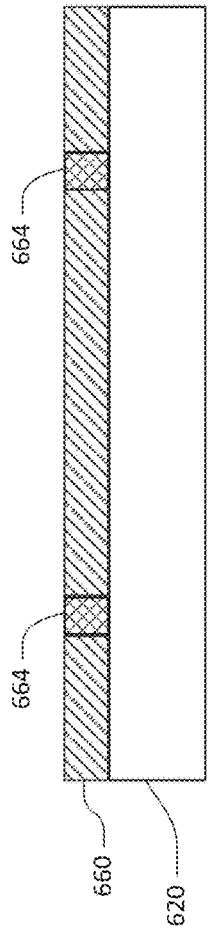

FIG. 6C illustrates formation of a lateral etch stop 664 in the buried oxide layer 660 where the portions 662 have been removed. The lateral etch stop 664 can be formed of polysilicon, and then planarized. The lateral etch stop 664 can be formed of a different material than the buried oxide layer 664, such that the lateral etch stop 664 is resistant to an etchant that can be used to etch away the buried oxide layer 660. In an example, the lateral etch stop 664 can be formed to correspond to the perimeter 145 of the cavity 140, as shown in FIG. 1.

Figure 6D:
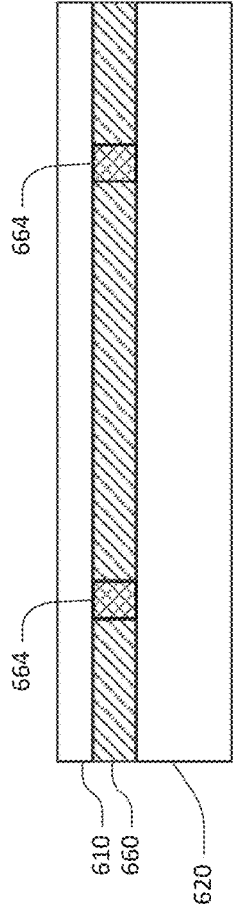

In FIG. 6D, piezoelectric plate 610 is bonded to the substrate 620 via the buried oxide layer 660 such that the buried oxide layer 660 is between the substrate 620 and the piezoelectric plate 610. The piezoelectric plate 610 and the substrate 620 may be bonded by a wafer bonding process. Typically, the mating surfaces of the buried oxide layer 660 and the piezoelectric plate 610 are highly polished. An intermediate material may be formed or deposited on the mating surface of one or both of the piezoelectric plate 610 and the buried oxide layer 660. One or both mating surfaces may be activated using, for example, a plasma process. The mating surfaces may then be pressed together with considerable force to establish molecular bonds between the piezoelectric plate 610 and the buried oxide layer 660 or intermediate material layers. A thickness of a portion of or all of the piezoelectric plate 610 can be adjusted at this point, for example, via polishing or etching.

Figure 6E:
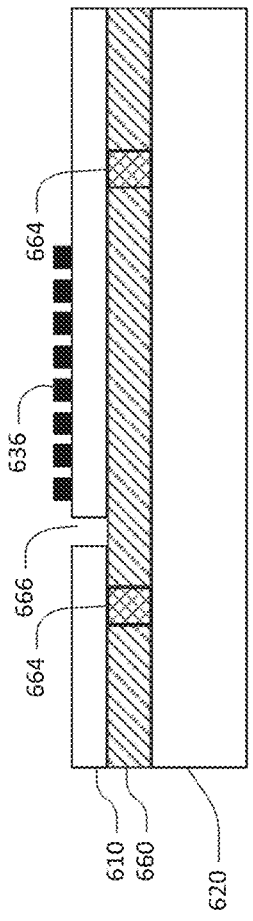

A conductor pattern 636, including IDTs of each XBAR, is formed in FIG. 6E by depositing and patterning one or more conductor layers on the front-side of the piezoelectric plate 610. The conductor pattern 636 may be, for example, aluminum, an aluminum alloy, copper, a copper alloy, or some other conductive metal. Optionally, one or more layers of other materials may be disposed below (i.e. between the conductor pattern and the piezoelectric plate) and/or on top of the conductor pattern. For example, a thin film of titanium, chrome, or other metal may be used to improve the adhesion between the conductor pattern 636 and the piezoelectric plate 610. A conduction enhancement layer of gold, aluminum, copper or other higher conductivity metal may be formed over portions of the conductor pattern 636 (for example the IDT bus bars and interconnections between the IDTs).

Further, a through hole 666 is formed through the piezoelectric plate 610 that extends to the buried oxide layer 660. The through hole 666 can be formed either mechanically or chemically, for example, by etching. The dimension and placement of the through hole 666 can be optimized for admittance of an etchant to the buried oxide layer 660, such that the through hole 666 does not disturb the functioning of the piezoelectric plate 610.

Optionally, a front-side dielectric layer (not shown) may be formed by depositing one or more layers of dielectric material on the front-side of the piezoelectric plate 610. The one or more dielectric layers may be deposited using a conventional deposition technique such as sputtering, evaporation, or chemical vapor deposition. The one or more dielectric layers may be deposited over the entire surface of the piezoelectric plate 610. Alternatively, one or more lithography processes (using photomasks) may be used to limit the deposition of the dielectric layers to selected areas of the piezoelectric plate 610, such as only between the interleaved fingers of the IDTs. Masks may also be used to allow deposition of different thicknesses of a frequency setting dielectric layer on different portions of the piezoelectric plate corresponding to different shunt resonators.

The formation of the conductor pattern and the dielectric layer may be performed in either order or may be performed as a single integrated sequence of process steps. For example, the front-side dielectric layer may be deposited over the front surface of the piezoelectric plate. The front-side dielectric layer may then be coated with photoresist. The photoresist may then be exposed through a mask to define the areas where the IDT fingers and other conductors will be formed. The front-side dielectric layer may then be etched to remove the dielectric material from the areas where the IDT fingers and other conductors will be formed. The conductor metal can then be deposited to cover the remaining photoresist and fill the areas where the front-side dielectric layer was removed. The photoresist can then be stripped, lifting off the excess conductor metal and leaving the IDT fingers in the grooves previously etched in the front-side dielectric layer. The conductor pattern and the front-side dielectric layer may be formed using some other sequence of process steps.

Figure 6F:
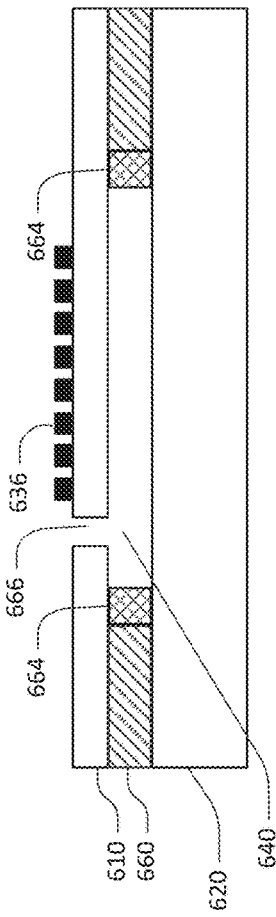

FIG. 6F illustrates removal of a portion of the buried oxide layer 660 defined by the lateral etch stops 664 to form a cavity 640. In one example, the portion of the buried oxide layer 660 can be removed via an etchant introduced via the through hole 666. An etchant is selected that will etch away the material of the buried oxide layer 660, but will not etch away the lateral etch stops 664, the piezoelectric plate 610, or the substrate 620. In another example, the substrate 620 may be partially etched so that the cavity 640 extends partially into the substrate 620. In either case, the resulting resonator devices will have a cross-section similar to the XBAR shown in FIG. 3 where the cavity does not extend entirely through the substrate.

The XBAR or filter is then completed, which may include, for example, depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur is to tune the resonant frequencies of the resonators within the device by adding or removing metal or dielectric material from the front-side of the device. This tuning may also include selectively removing material from shunt resonators to create multiple frequency setting dielectric layer thicknesses.

FIGS. 7A-7F are schematic cross-sectional views of an alternative XBAR illustrating steps of a process of making the alternative XBAR or a filter incorporating alternative XBARs. The process starts in FIG. 7A with a substrate 720 and ends at FIG. 7F with a completed XBAR or filter. FIGS. 7A-7F include only major process steps. Various conventional process steps (e.g. surface preparation, cleaning, inspection, baking, annealing, monitoring, testing, etc.) may be performed before, between, after, and during the steps shown in FIGS. 7A-7F. The substrate 720 and the piezoelectric plate 710 in later figures are formed of the same material, and may be lithium niobate or lithium tantalate, and Z-cut, rotated Z-cut, or rotated YX-cut, or some other cut.

Figure 7A:
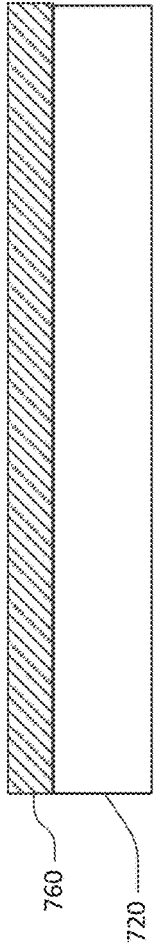
FIGS. 7A-7F are schematic cross-sectional views of an alternative XBAR illustrating steps of a process of making the alternative XBAR.

In FIG. 7A, a buried oxide layer 760 may be formed by depositing $SiO_2$, $Al_2O_3$, or another dielectric material on a surface of the substrate. Once deposited, the buried oxide layer 760 may need planarization or other processing to achieve a suitable surface. Alternatively, the buried oxide layer 760 can be formed separately and then bonded to the substrate 720. Typically, the mating surfaces of the buried oxide layer 760 and the substrate 720 are highly polished. An intermediate material may be formed or deposited on the mating surface of one or both of the substrate 720 and the buried oxide layer 760. One or both mating surfaces may be activated using, for example, a plasma process. The mating surfaces may then be pressed together with considerable force to establish molecular bonds between the substrate 720 and the buried oxide layer 760 or intermediate material layers. A thickness of the buried oxide layer 760 may be adjusted at this step, for example, by polishing or etching. In an example, a thickness of the buried oxide layer can be in a range from 2 microns to 50 microns (e.g., 2 microns to 20 microns).

Figure 7B:

In FIG. 7B, a portion 770 of the buried oxide layer 760 is removed that corresponds to a cavity to be formed. The portion 770 can be removed via any suitable method, such as mechanical removal or selective etching. Alternatively, the buried oxide layer 760 can be formed or deposited with this portion 770 already removed, for example, by using a mask.

Figure 7C:
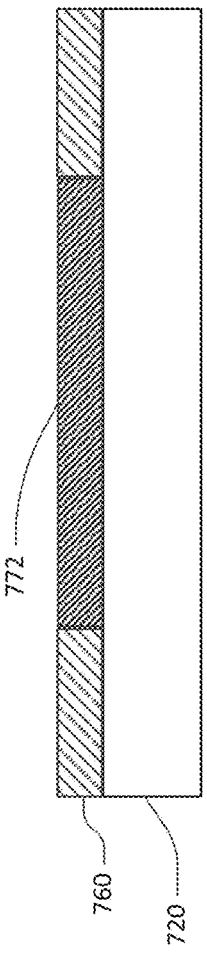

FIG. 7C illustrates formation of a sacrificial layer 772 in the buried oxide layer 760 where the portion 770 has been removed. The sacrificial layer 772 can be formed, for example, of phosphosilicate glass or polysilicon. The sacrificial layer 772 can be formed of a different material than the buried oxide layer 764, such that the buried oxide layer 660 is resistant to an etchant that can be used to etch away the sacrificial layer 772 in a later step. In an example, the sacrificial layer 772 can be formed to correspond to the perimeter 145 of the cavity 140, as shown in FIG. 1.

Figure 7D:
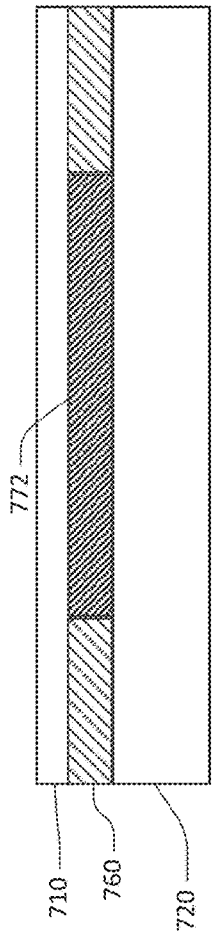

In FIG. 7D, piezoelectric plate 710 is bonded to the substrate 720 via the buried oxide layer 760 such that the buried oxide layer 760 is between the substrate 720 and the piezoelectric plate 710. The piezoelectric plate 710 and the substrate 720 may be bonded by a wafer bonding process. Typically, the mating surfaces of the buried oxide layer 760 and the piezoelectric plate 710 are highly polished. An intermediate material may be formed or deposited on the mating surface of one or both of the piezoelectric plate 710 and the buried oxide layer 760. One or both mating surfaces may be activated using, for example, a plasma process. The mating surfaces may then be pressed together with considerable force to establish molecular bonds between the piezoelectric plate 710 and the buried oxide layer 760 or intermediate material layers. A thickness of a portion of or all of the piezoelectric plate 710 can be adjusted at this point, for example, via polishing or etching.

Figure 7E:
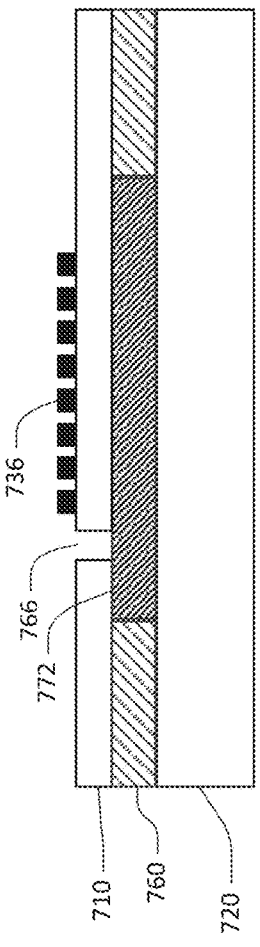

A conductor pattern 736, including IDTs of each XBAR, is formed in FIG. 7E by depositing and patterning one or more conductor layers on the front-side of the piezoelectric plate 710. The conductor pattern 736 may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor pattern. For example, a thin film of titanium, chrome, or other metal may be used to improve the adhesion between the conductor pattern 736 and the piezoelectric plate 710. A conduction enhancement layer of gold, aluminum, copper or other higher conductivity metal may be formed over portions of the conductor pattern 636 (for example the IDT bus bars and interconnections between the IDTs).

Further, a through hole 766 is formed through the piezoelectric plate 710 that extends to the buried oxide layer 760. The through hole 766 can be formed either mechanically or chemically, for example, by etching. The dimension and placement of the through hole 766 can be optimized for admittance of an etchant to the buried oxide layer 760, such that the through hole 766 does not disturb the functioning of the piezoelectric plate 710.

Optionally, a front-side dielectric layer may be formed by depositing one or more layers of dielectric material on the front-side of the piezoelectric plate 710. The one or more dielectric layers may be deposited using a conventional deposition technique such as sputtering, evaporation, or chemical vapor deposition. The one or more dielectric layers may be deposited over the entire surface of the piezoelectric plate 710. Alternatively, one or more lithography processes (using photomasks) may be used to limit the deposition of the dielectric layers to selected areas of the piezoelectric plate 710, such as only between the interleaved fingers of the IDTs. Masks may also be used to allow deposition of different thicknesses of a frequency setting dielectric layer on different portions of the piezoelectric plate corresponding to different shunt resonators.

The formation of the conductor pattern and the dielectric layer may be performed in either order or may be performed as a single integrated sequence of process steps. For example, the front-side dielectric layer may be deposited over the front surface of the piezoelectric plate. The front-side dielectric layer may then be coated with photoresist. The photoresist may then be exposed through a mask to define the areas where the IDT fingers and other conductors will be formed. The front-side dielectric layer may then be etched to remove the dielectric material from the areas where the IDT fingers and other conductors will be formed. The conductor metal can then be deposited to cover the remaining photoresist and fill the areas where the front-side dielectric layer was removed. The photoresist can then be stripped, lifting off the excess conductor metal and leaving the IDT fingers in the grooves previously etched in the front-side dielectric layer. The conductor pattern and the front-side dielectric layer may be formed using some other sequence of process steps.

Figure 7F:
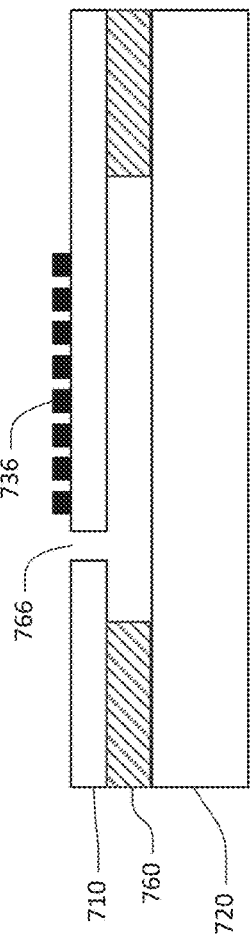

FIG. 7F illustrates removal of the sacrificial layer 772 to form a cavity 640. In one example, the sacrificial layer 772 can be removed via an etchant introduced via the through hole 766. An etchant is selected that will etch away the material of the sacrificial layer 772, but will not etch away the piezoelectric plate 610 or the substrate 620. In another example, the substrate 620 may be partially etched so that the cavity 640 extends partially into the substrate 620. In either case, the resulting resonator devices will have a cross-section similar to the XBAR shown in FIG. 3 where the cavity does not extend entirely through the substrate.

The XBAR or filter is then completed, for example, as described with respect to FIG. 6F.

FIGS. 8A-8D are schematic cross-sectional views of another alternative XBAR illustrating steps of a process of making the alternative XBAR or a filter incorporating alternative XBARs. The process starts in FIG. 8A with a substrate 820 and ends at FIG. 8D with a completed XBAR or filter. FIGS. 8A-8D include only major process steps. Various conventional process steps (e.g. surface preparation, cleaning, inspection, baking, annealing, monitoring, testing, etc.) may be performed before, between, after, and during the steps shown in FIGS. 8A-8D. The substrate 820 and the piezoelectric plate 810 in later figures are formed of the same material, and may be lithium niobate or lithium tantalate, and Z-cut, rotated Z-cut, or rotated YX-cut, or some other cut.

Figure 8A:
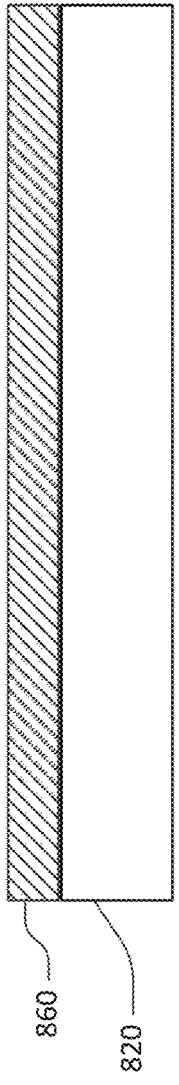
FIGS. 8A-8D are schematic cross-sectional views of another alternative XBAR illustrating steps of a process of making the other alternative XBAR.

In FIG. 8A, a buried oxide layer 860 may be formed by depositing $SiO_2$, $Al_2O_3$, or another dielectric material on a surface of the substrate. Once deposited, the buried oxide layer 860 may need planarization or other processing to achieve a suitable surface. Alternatively, the buried oxide layer 860 can be formed separately and then bonded to the substrate 820. Typically, the mating surfaces of the buried oxide layer 860 and the substrate 820 are highly polished. An intermediate material may be formed or deposited on the mating surface of one or both of the substrate 820 and the buried oxide layer 860. One or both mating surfaces may be activated using, for example, a plasma process. The mating surfaces may then be pressed together with considerable force to establish molecular bonds between the substrate 820 and the buried oxide layer 860 or intermediate material layers. A thickness of the buried oxide layer 860 may be adjusted at this step, for example, by polishing or etching. In an example, the thickness of the buried oxide layer 860 can be in a range from 10 nm to 50 microns.

Figure 8B:
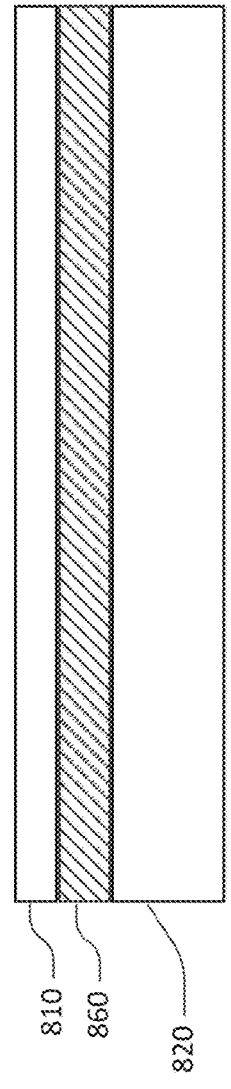

In FIG. 8B, piezoelectric plate 810 is bonded to the substrate 820 via the buried oxide layer 860 such that the buried oxide layer 860 is between the substrate 820 and the piezoelectric plate 810. The piezoelectric plate 810 and the substrate 820 may be bonded by a wafer bonding process.

Typically, the mating surfaces of the buried oxide layer 860 and the piezoelectric plate 810 are highly polished. An intermediate material may be formed or deposited on the mating surface of one or both of the piezoelectric plate 810 and the buried oxide layer 860. One or both mating surfaces may be activated using, for example, a plasma process. The mating surfaces may then be pressed together with considerable force to establish molecular bonds between the piezoelectric plate 810 and the buried oxide layer 860 or intermediate material layers. A thickness of a portion of or all of the piezoelectric plate 810 can be adjusted at this point, for example, via polishing or etching.

Figure 8C:
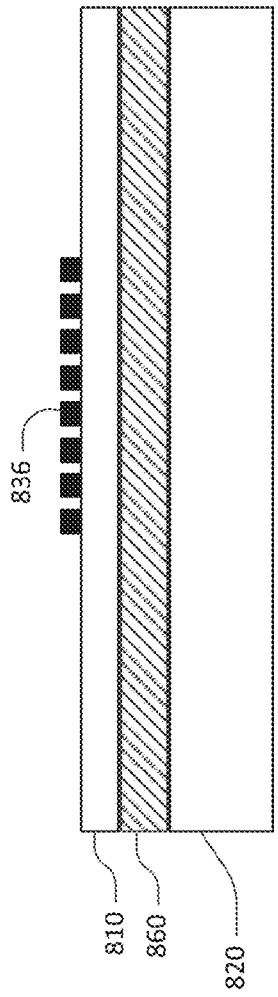

A conductor pattern 836, including IDTs of each XBAR, is formed in FIG. 8C by depositing and patterning one or more conductor layers on the front-side of the piezoelectric plate 810. The conductor pattern 836 may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor pattern. For example, a thin film of titanium, chrome, or other metal may be used to improve the adhesion between the conductor pattern 836 and the piezoelectric plate 810. A conduction enhancement layer of gold, aluminum, copper or other higher conductivity metal may be formed over portions of the conductor pattern 836 (for example the IDT bus bars and interconnections between the IDTs).

Optionally, a front-side dielectric layer may be formed by depositing one or more layers of dielectric material on the front-side of the piezoelectric plate 810. The one or more dielectric layers may be deposited using a conventional deposition technique such as sputtering, evaporation, or chemical vapor deposition. The one or more dielectric layers may be deposited over the entire surface of the piezoelectric plate 810. Alternatively, one or more lithography processes (using photomasks) may be used to limit the deposition of the dielectric layers to selected areas of the piezoelectric plate 810, such as only between the interleaved fingers of the IDTs. Masks may also be used to allow deposition of different thicknesses of a frequency setting dielectric layer on different portions of the piezoelectric plate corresponding to different shunt resonators.

The formation of the conductor pattern and the dielectric layer may be performed in either order or may be performed as a single integrated sequence of process steps. For example, the front-side dielectric layer may be deposited over the front surface of the piezoelectric plate. The front-side dielectric layer may then be coated with photoresist. The photoresist may then be exposed through a mask to define the areas where the IDT fingers and other conductors will be formed. The front-side dielectric layer may then be etched to remove the dielectric material from the areas where the IDT fingers and other conductors will be formed. The conductor metal can then be deposited to cover the remaining photoresist and fill the areas where the front-side dielectric layer was removed. The photoresist can then be stripped, lifting off the excess conductor metal and leaving the IDT fingers in the grooves previously etched in the front-side dielectric layer. The conductor pattern and the front-side dielectric layer may be formed using some other sequence of process steps.

Figure 8D:
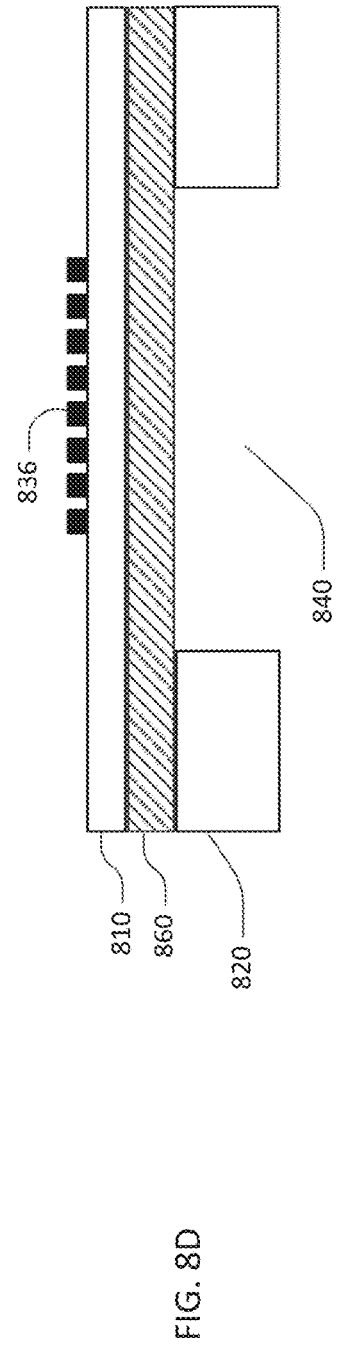

In FIG. 8D, one or more cavities 840 are formed in the back-side of the substrate 820. A separate cavity may be formed for each resonator in a filter device. The one or more cavities may be formed using an anisotropic or orientation-dependent dry or wet etch to open holes through the back-side of the substrate 820 to the buried oxide layer 860 or the piezoelectric plate 810. In the example shown, the cavity 840 extends through the substrate 820, but not through the buried oxide layer 860. In other examples, the cavity 840 extends through the buried oxide layer 860 to the piezoelectric plate 810. In this case, the resulting resonator devices will have a cross-section similar to the device shown in FIG. 1.

The XBAR or filter is then completed, for example, as described with respect to FIG. 6F.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A method of fabricating an acoustic resonator device comprising:
   forming a buried oxide layer above a substrate;
   forming a lateral etch stop in the buried oxide layer;
   attaching a piezoelectric plate to the buried oxide layer, such that the buried oxide layer is between the substrate and the piezoelectric plate, and attaches the substrate to the piezoelectric plate; and
   forming a conductor pattern comprising an interdigital transducer (IDT) at a portion of the piezoelectric plate that forms a diaphragm spanning a cavity, such that interleaved fingers of the IDT are at the diaphragm, wherein the substrate and the piezoelectric plate are the same material.

2. The method of claim 1, further comprising forming the cavity to extend entirely through the substrate.

3. The method of claim 1, further comprising forming the cavity to extend through a portion of the substrate, such that the cavity does not extend entirely through the substrate.

4. The method of claim 1, further comprising:
   forming the lateral etch stop to define a boundary of the cavity; and forming the cavity via an etchant etching the buried oxide layer within the boundary of the cavity.

5. The method of claim 4, further comprising introducing the etchant to the cavity via a through hole in the diaphragm.

6. The method of claim 1, further comprising forming the cavity to extend through the substrate and the buried oxide layer.

7. The method of claim 1, further comprising forming the cavity such that the cavity does not extend into the substrate.

8. The method of claim 1, wherein the buried oxide layer is one of $SiO_2$ and $Al_2O_3$.

9. The method of claim 1, further comprising forming the buried oxide layer to not extend across the cavity.

10. The method of claim 9, wherein the substrate and piezoelectric plate are one of Z-cut, rotated Z-cut, and rotated YX-cut.

11. The method of claim 1, wherein a thickness of the buried oxide layer is in a range between 10 nm and 50 microns.

12. The method of claim 1, further comprising configuring the piezoelectric plate and interleaved fingers, such that a radio frequency signal applied to the IDT excites a primary shear acoustic mode in the diaphragm.

13. The method of claim 1, wherein the substrate and piezoelectric plate are one of lithium niobate and lithium tantalate.

14. A method of fabricating an acoustic resonator device, the method comprising:
   forming a buried oxide layer above a substrate;
   attaching a piezoelectric plate to the buried oxide layer, such that the buried oxide layer is between the substrate and the piezoelectric plate, and attaches the substrate to the piezoelectric plate;
   forming a conductor pattern comprising an interdigital transducer (IDT) at a portion of the piezoelectric plate that forms a diaphragm spanning a cavity, such that interleaved fingers of the IDT are at the diaphragm, wherein the substrate and the piezoelectric plate are the same material; and
   forming a sacrificial layer in a portion of the buried oxide layer corresponding to the cavity.

15. The method of claim 14, further comprising removing the sacrificial layer to form the cavity.

16. The method of claim 15, further comprising:
   forming a through hole in the diaphragm; and
   removing the sacrificial layer by an etchant introduced to the cavity via the through hole.

17. The method of claim 14, further comprising forming the sacrificial layer of phosphosilicate glass or polysilicon.

18. A method of fabricating an acoustic resonator device, the method comprising:
   forming a buried oxide layer above a substrate;
   attaching a piezoelectric plate to the buried oxide layer, such that the buried oxide layer is between the substrate and the piezoelectric plate, and attaches the substrate to the piezoelectric plate;
   forming a conductor pattern comprising an interdigital transducer (IDT) at a portion of the piezoelectric plate that forms a diaphragm spanning a cavity, such that interleaved fingers of the IDT are at the diaphragm;
   wherein the substrate and the piezoelectric plate are the same material, and
   wherein the buried oxide layer extends across the cavity.

* * * * *